United States Patent [19]

Nagai et al.

[11] Patent Number: 5,184,308
[45] Date of Patent: Feb. 2, 1993

[54] FAULT SIMULATION METHOD

[75] Inventors: Masahiko Nagai, Kanagawa; Hiroo Watai, Hadano; Takaharu Nagumo, Kokubunji; Kaoru Moriwaki, Hadano, all of Japan

[73] Assignee: Hitachi, Ltd., Tokyo, Japan

[21] Appl. No.: 591,148

[22] Filed: Oct. 1, 1990

[30] Foreign Application Priority Data

Oct. 2, 1989 [JP] Japan ................... 1-257236

[51] Int. Cl.$^5$ ............................................. G06F 15/60
[52] U.S. Cl. .................................. 364/489; 364/578; 371/23
[58] Field of Search ............................... 364/488–491, 364/578; 371/23

[56] References Cited

U.S. PATENT DOCUMENTS

| | | | |
|---|---|---|---|
| 4,791,578 | 12/1988 | Fazio et al. | 371/23 X |
| 4,815,016 | 3/1989 | Young | 364/578 |
| 4,937,765 | 6/1990 | Shupe et al. | 371/23 X |
| 4,942,536 | 7/1990 | Watanabe et al. | 364/489 X |
| 4,954,953 | 9/1990 | Bush | 364/578 |
| 4,996,659 | 2/1991 | Yamaguchi et al. | 371/23 |
| 5,018,089 | 5/1991 | Kanazawa | 371/23 |

FOREIGN PATENT DOCUMENTS 62-221745 3/1986 Japan .

OTHER PUBLICATIONS

"Logic Simulation Speeded With New Special Hardware", J. R. Lineback; Electronics vol. 55, No. 12 (Jun. 16, 1982). pp. 45–46.

Primary Examiner—Kevin J. Teska
Attorney, Agent, or Firm—Kenyon & Kenyon

[57] ABSTRACT

A logic circuit to be an object for fault simulation is logically modified into a logic circuit configuration using logic gates of a predetermined basic gate form. Pin management data indicative of a correspondence of pins of the logic gates to a position of fault assumption of each of the pins prior to logic modification is formed. Logic simulation is then performed by injecting a fault logic value into the position of fault assumption of each of the pins of the gate of the logic circuit subsequent to the logic modification corresponding to each of the pins prior to the logic modification with reference to the pin management data, thereby implementing a fault simulation for detecting the fault of the logic circuit.

8 Claims, 5 Drawing Sheets

F I G. 1
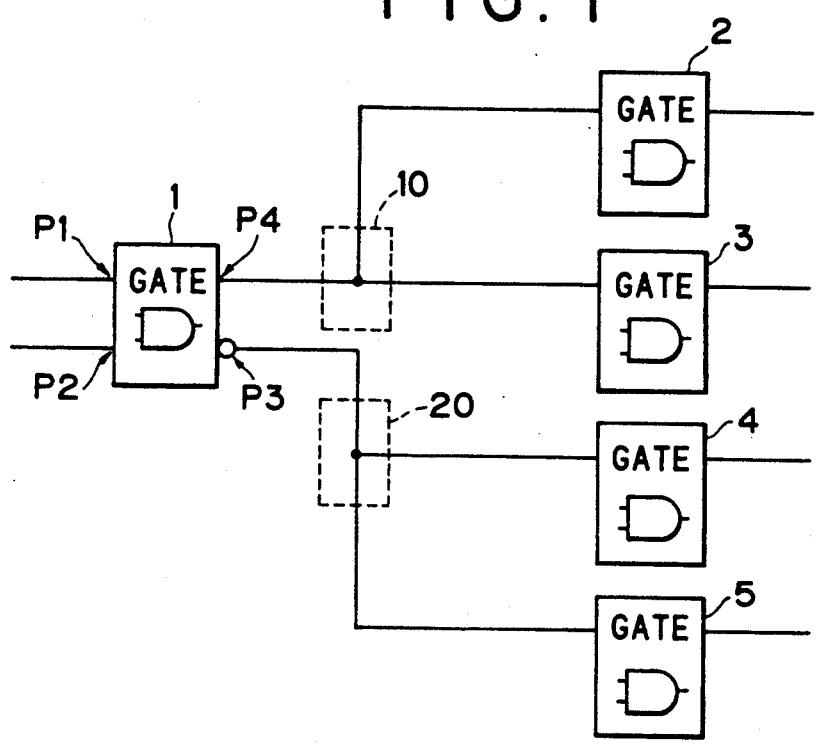
F I G. 2
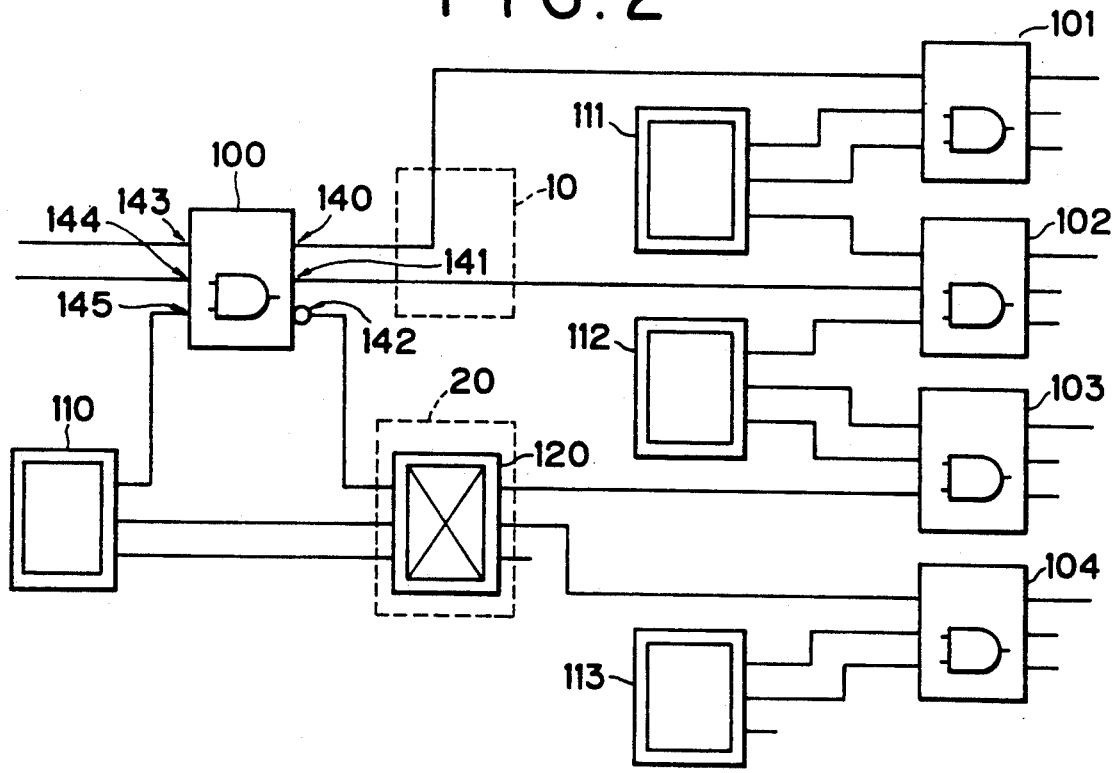

406: GATE CONNECTION DATA

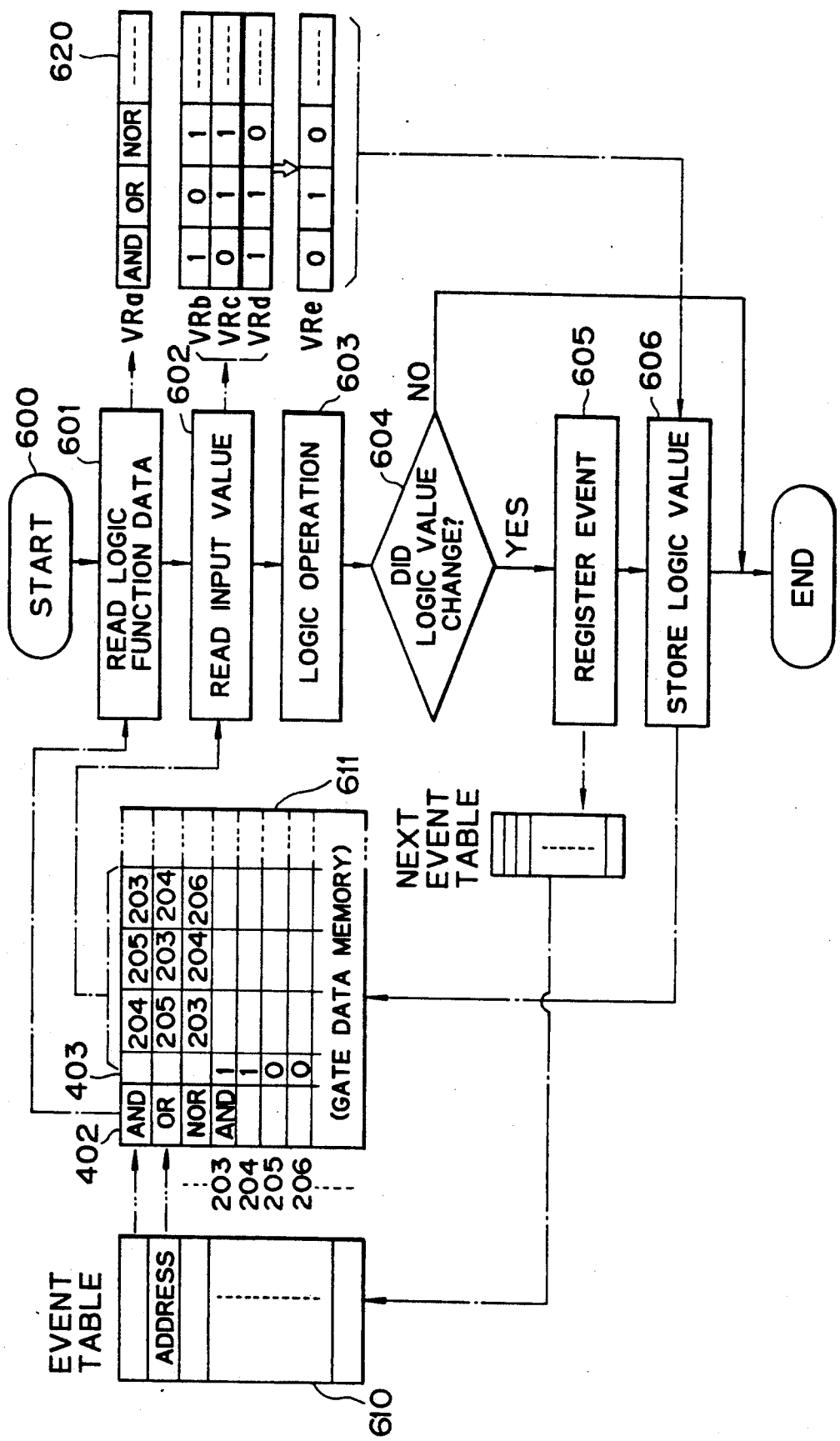

FAULT SIMULATION METHOD

BACKGROUND OF THE INVENTION

The present invention relates to a fault simulation method and, more particularly, to a fault simulation method adapted to perform fault simulation of a logic circuit at a high speed.

Logic simulation is a known technique for realizing the operation of a logic circuit on a computer and analyzing the operation of the logic circuit. Logic simulation has been performed at a high speed by using a vector processor capable of implementing the operation of a large amount of vector data. This technique implements integration of gates in order to reduce the number of loading and storing operation for performing the vector operation at a high speed. In performing the vector operation by the vector processor, it is preferred that a record length of data as an object for the operation is a fixed length, so that the logic modification is implemented to fix the number of input and output pins of each of the logic gates for performing the logic simulation. The logic circuit to be the object for the logic simulation is logically modified into a logic circuit configuration using logic gates in which the number of input and output pins is constant, and the logic gate data for describing the logic gate is assigned a fixed data length so that the length of each of the data to be operated on by the vector processor is a fixed length.

A logic simulation method of the logic circuit of this type is disclosed, for example in Japanese Patent Unexamined Publication (kokai) No. 221,745/1987 entitled "Logic Circuit Simulation Method". This logic circuit simulation method provides a logic simulator for simulating a logic operation of the logic circuit to carry out the simulation in accordance with three steps. First, the number of input signals (the number of input and output pins) of a gate forming a simulation circuit to be simulated is processed to agree with a predetermined basic gate form. In the second step, an output signal value of the gate is propagated in sequence from one gate to another and all of the propagating gates in the logic circuit are divided into units of destinations of the propagating gates. The third step performs a batch calculation of output signal values of an aggregate of the divided gates.

A fault simulation method is known in which fault simulation is performed by injecting a fault value into a fault assumption portion of a logic circuit to which fault simulation is to be proformed and by implementing simulation in a manner similar to the logical simulation. This fault simulation method has the difficulty that a fault propagates as it expands through the logic circuit so that the processing for following a path of the propagation of the fault becomes very complicated. The logic circuit to which the fault simulation is performed in this case is restricted to a gate having only one output and a fault logic value is set in the pin of the gate, thereby injecting the fault into the logic circuit.

It is noted that in order to implement processing at a high speed in performing logic simulation by using a vector processor, the logic circuit is logically modified into the logic circuit configuration using logic gates of a basic gate form in which the number of the input and output pins of each logic gate is fixed, so that the positions of the pins of the gate of the actual logic circuit to which logic simulation is performed may not correspond to the pins of the gate subsequent to the logical modification in a 1-to-1 manner. Therefore, the fault value cannot readily be injected into the fault assumption portion of the logical circuit concerned, so that the fault simulation cannot appropriately be executed. In order to enable a 1-to-1 correspondence of the positions of the pins of the gate of the actual logic circuit as the object for the logic simulation to the positions of the pins of the gate subsequent to the logical modification, the logic circuit can be logically modified by the logic gate of a basic gate form in which the number of input and output pins is fixed. However, this logical modification requires a surplus of fixed value gates and generating gates, thereby having the difficulty that the fault simulation of a large-scale logic circuit cannot be performed at a high speed.

It is further noted that the injection of the fault logic value for performing the fault simulation requires the fault logic value of the gate or pin which assumes a fault to be changed during the fault simulation, so that if the fault logic value cannot easily be injected, it is required that conditions should be branched off in a complex manner during the fault simulation. This cannot take advantage of the high-speed processing ability of a vector processor to a sufficient extent.

SUMMARY OF THE INVENTION

Therefore, it is an object of the present invention to provide a fault simulation method capable of performing fault simulation at a high speed using a vector processor.

It is another object of the present invention to provide a fault simulation method which enables a ready injection of the fault logic value and permits fault simulation processing which takes advantage of the high-speed processing capability of a vector processor to a sufficient extent.

In order to achieve the objects described hereinabove, the present invention consists of a fault simulation method for detecting a fault in a logic circuit by injecting a fault logic value into a position of fault assumption in the logic circuit into the logic circuit to be an object for fault simulation and by performing logical simulation, comprising the steps of:

performing logical modification of the logic circuit to be the object for fault simulation into a logic circuit configuration implemented using a logic gate of a predetermined basic gate form;

generating pin management data indicative of correspondence the of pins to the position of fault assumption of each of the pins prior to the logical modification; and injecting the fault logic value into the position of fault assumption of each of the pins of the gate of the logic circuit subsequent to the logical modification corresponding to each of the pins prior to the logic modification with reference to the pin management data.

It is to be noted that the injection of the fault logic value is characterized by connecting the fixed value gate of the logic gate of a basic gate form generating the fault logic value to the input pin of the logic gate into which the fault logic value is injected.

With this arrangement, the logic gate data of the logic circuit to be the object for the fault simulation is data, having a fixed length so that the fault simulation is implemented by logically modifying the logic gate into the logic circuit configuration of the logic gate of the basic gate form having a constant number of input and output pins and by injecting the fault logic value into the logic gate of the logic circuit logically modified. Therefore, the fault simulation can be processed at a high speed by processing the fixed-length data with a vector processor. When the logic gate has been modified logically, pin management data is generated which indicates correspondence of each of the pins of the gate subsequent to the logical modification to the position of fault assumption of each of the pins of the gate prior to the logical modification, and the fault logic value is injected into the logic gate of the logic circuit modified logically. More specifically, the fault logic value is injected into the fault assumption position of each of the pins of the gate of the logic circuit subsequent to the logical modification corresponding to each of the pins prior to the logical modification with reference to the pin management data. The injection of the fault logic value is implemented by connecting the fixed-length gate having the fault logic value for injection to the logic gate of the logically modified logic circuit into which the fault logic value is injected. The pin management data used herein is data managing the position of a fault pin indicating that the logic gate into which the fault logic value is injected corresponds to which position of fault assumption prior to the logical modification. Further, the pin management data manages the injection of the fault logic value providing a fault-value injecting indicator for recording and managing all the pin positions in which the fault is required to be assumed on the logic circuit to be the object for the fault simulation. The pin management data can manage the correspondence of the position of each pin of the logic gate having the fault logic value injected upon implementation of the fault simulation to the pin position prior to the logical modification. Further, the pin management data can manage the injection of the fault in correspondence with each of the pin positions, thereby proceeding with the fault simulation with high efficiency.

The logic gate data on the logically modified logic gate has an addition of the least necessary generating gate and describes the logic circuit on the gate having a fixed number of input and output pins, so that a large-scale logic circuit may be simulated on a vector processor at a high speed. As the pin management data records all of the locations in which the fault is required to be assumed on the logic circuit to be the object for the fault simulation from the relationship between the pin positions prior to and subsequent to the logical modification, the fault simulation can accurately be performed without omission. A fixed value gate of the basic gate form may be used to enable handling of the fixed value gate in the same manner as the basic gate or the generating gate so that the fault simulation for the injected fault can be performed by changing the connection of the fixed value gate, thereby realizing the fault simulation at a high speed.

Other objects, features and advantages of the present invention will become apparent in the course of the description of the preferred embodiments, which follows, in conjunction with the accompanying drawings.

BRIEF DESCRIPTION OF THE DRAWINGS

FIG. 1 is a circuit diagram showing an example of logic circuits to be an object for fault simulation.

FIG. 2 is a diagrammatic representation showing an example of the logic circuits, which is obtained by logically modifying the logic circuit of FIG. 1 into a logic circuit configuration using logic gates of a basic gate form.

FIG. 6 is a flowchart showing and describing the operation of the fault simulation processing with the vector processor with reference to a flow of data.

DETAILED DESCRIPTION OF THE PREFERRED EMBODIMENTS

Figure 3A:
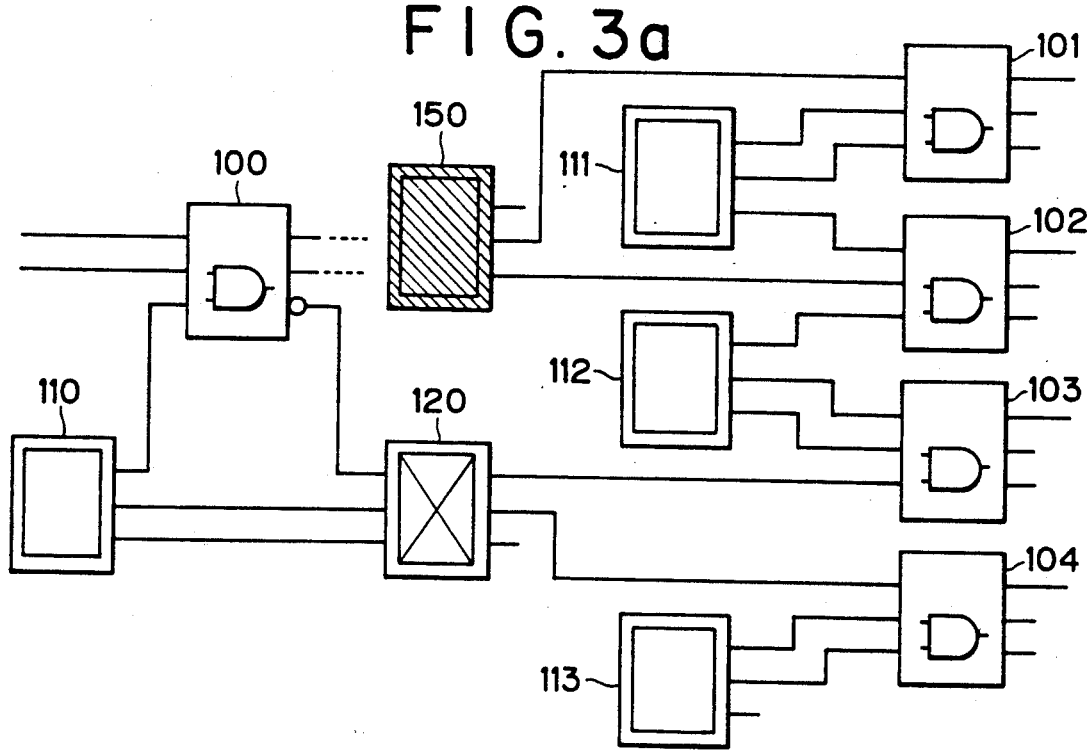
FIGS. 3a and 3b are diagrammatic representations showing each of the logic circuit configurations when the fault is injected by connecting the fixed value gate to the logic circuit of FIG. 2.

FIG. 1 is a circuit diagram showing an example of a logic circuit on which fault simulation is to be performed. As shown in FIG. 1, reference numerals 1 to 5, inclusive, denote gates, in which gate 1 is a gate with two inputs and two outputs, while gates 2 to 5, inclusive, are each gates having one input and one output. One of the two outputs of gate 1 is branched at a branch point 10 and connected to gates 2 and 3 while the other of the two outputs is branched at a branch point 20 and then connected to gates 4 and 5. Therefore, four outputs are required in order to simulate the output of gate 1.

The fault simulation method of the present invention implements fault simulation with a vector processor at a high speed by using logic gate data of a logic circuit for the object of the fault simulation as fixed length data. The logical modification may be implemented by using a logic gate with three inputs and three outputs, for example, as a logic gate of a basic gate form in which the number of input and output pins is fixed. While the basic gate form has been chosen for purposes of this embodiment as having three inputs and three outputs, it may be appreciated by one of ordinary skill in the art that other numbers of fixed input and output pins may be used in other embodiments of the present invention. The logical circuit of FIG. 1 is logically modified into a logical circuit as shown in FIG. 2. Basic gates 100 to 104, inclusive, correspond to gates 1 to 5, inclusive, of the logic circuit of FIG. 1. As the logical modification is implemented for purposes of illustration by using logic gates having three inputs and three outputs, three of the four outputs of gate 1 can be described as they are. However, since gate 1 has four outputs, it is necessary to add a generating gate 120 disposed to correspond to branch point 20 in order to branch off and add an additional fourth output which lacks in gate 100.

As described hereinabove, the number of inputs and outputs of gate 1 is adjusted by adding generating gate 120 to basic gates 100 to 104 and the logic circuit of FIG. 1 is logically modified into a circuit configuration using logic gates of a basic gate form. Outputs from fixed value gates 110, 111, 112 and 113 are connected to the inputs of basic gates 100, 101, 102, 103 and 104 and of generating gate 120 which are not required for description of the logic circuit of FIG. 1. Fixed value gates 110 to 113, generate a fixed logic value which does not exert any influence upon the operation of each gate. For instance, if the logic function of basic gate 100 shown in FIG. 2 is AND, an input 145 having a logic value "1" is connected from fixed value gate 110. Each of the inputs of the other basic gates 101, 102, 103 and 104 as well as generating gate 120 is likewise connected to outputs from fixed value gates 110 to 113, inclusive, with a logic value that has no influence upon the operation of each gate.

The logic circuit of FIG. 2 generated by logic modification in the manner described hereinabove is such that each of the logic gates is described as logic gate data of a fixed data length and an aggregate of the logic gate data describes one logic circuit.

Figure 4:
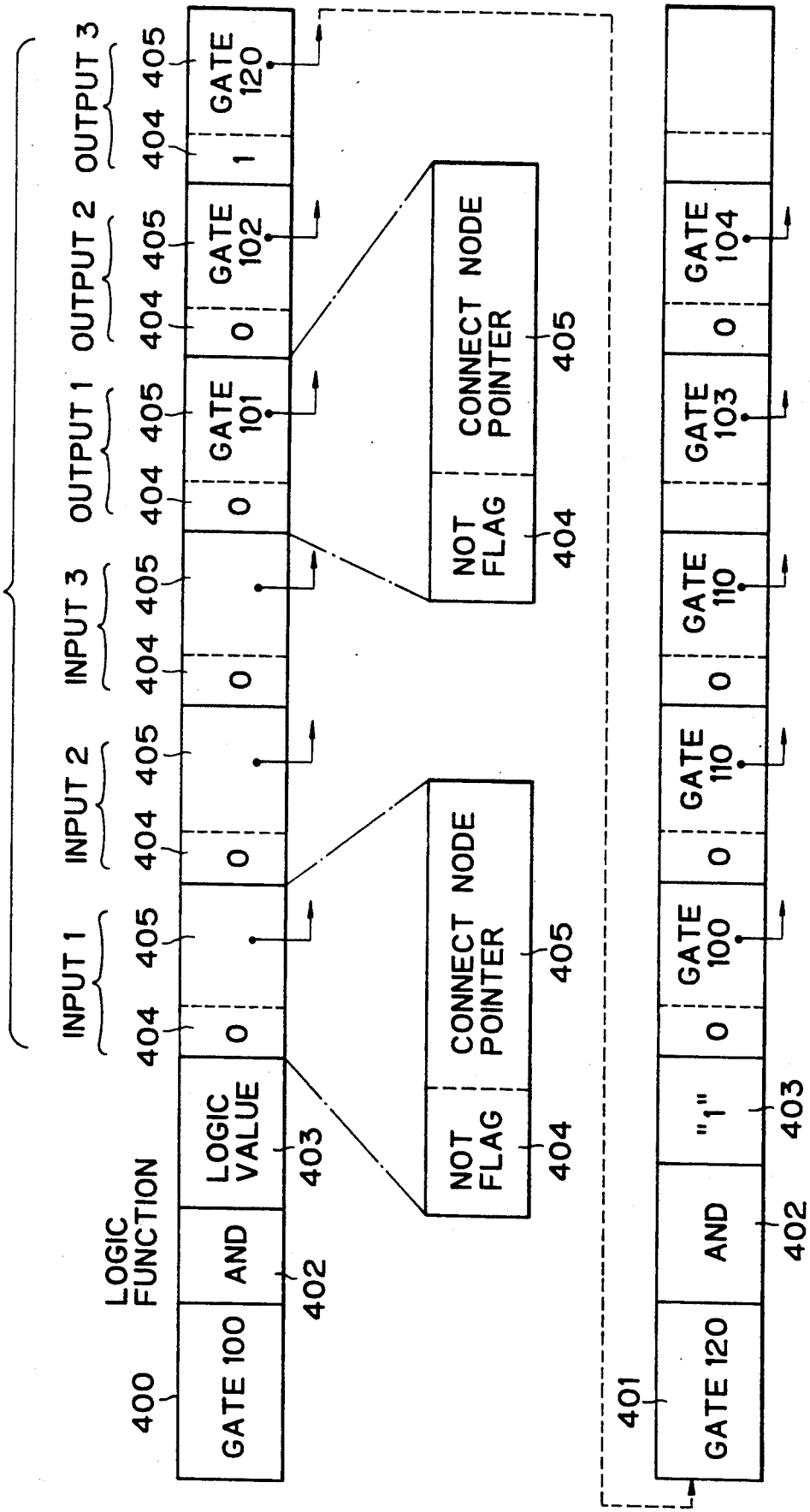
FIG. 4 is a diagrammatic representation showing an example of formats of the logic gate data describing the logic gate of the basic gate form.

FIG. 4 is a diagrammatic representation of an example of a format of logic gate data describing the logic gate having a basic gate form. For instance, basic gate 100 illustrating the logic circuit of FIG. 2 is described using logic gate data 400 of fixed data length as shown in FIG. 4. On the other hand, generating gate 120 is described using logic gate data 401 of data having a fixed length and the same format as basic gate 100. Each of the logic gate data is described using a common format for each of the basic gates, the generating gate and the fixed value gates, thereby having logic function data field 402, logic value data field 403 and gate connection data field 406. The contents of logic function data field 402 represents a logic function of the gate, i.e., the function of a logic operation, such as AND, OR, flip-flop and so on. The logic value data field 403 is disposed to retain an output value in executing the simulation and propagating a logic output. The logic value data field 403 is kept blank when the output of each gate is not fixed at the time of logic modification. The gate connection data field 406 is constructed to contain connection data corresponding to the number of inputs and outputs of the gate (in this embodiment, the number of inputs and outputs totals six, consisting of three inputs and three outputs). For example, each of the connection data of input 1, input 2 and input 3 in the logic gate data 400 of basic gate 100 corresponds to an input 143, an input 144 and an input 145, respectively, of basic gate 100 as illustrated in FIG. 2. Additionally, each of the connection data of output 1, output 2 and output 3 corresponds to an output 140, an output 141 and an output 142, respectively of the basic gate 100. Connection data field 406 has a NOT flag 404 representing the presence or absence of inversion of the logic values at each of the inputs and the outputs ("1" representing the presence of logic value inversion, "0" representing the absence of logic value inversion) and a connect node pointer 405 pointing to the logic gate data of the gate to which the input or outputs to be connected. FIG. 4 indicates the logic gate data 400 of the basic gate 100 and the logic gate data 401 of the generating gate 120 in the logic circuit of FIG. 2.

Simultaneously when an aggregate of the logic gate data as shown in FIG. 4 is generated to correspond to the configuration of the logic circuit logically modified in the manner as described hereinabove, pin management data is generated for managing the position of a fault pin upon introducion of a fault logic value into the pin of the logic gate.

Figure 5:
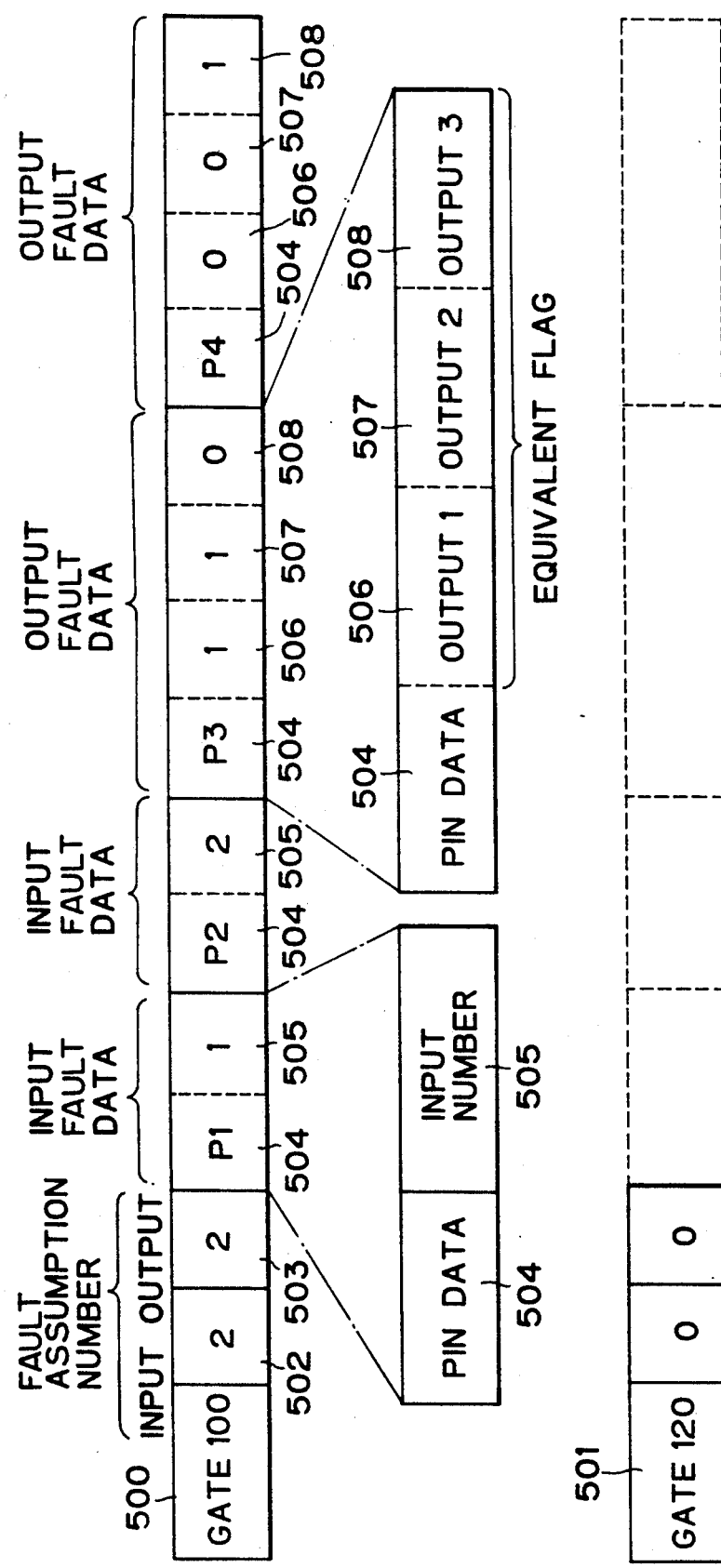
FIG. 5 is a diagrammatic representation showing an example of formats of the pin management data for managing the fault assumption positions when the fault logic value is injected into the input and output pins of the logic gate.

FIG. 5 is a diagrammatic representation of an example of a format of the pin management data for managing a fault assumption position upon introduction of the fault logic value into the input and output pins of the logic gate. The pin management data is generated to correspond to all gates of the logic gate data generated by the logic modification. For example, pin management data 500 is generated for the logic gate data 400 (FIG. 4) of the basic gate 100 indicating the logic circuit of FIG. 2, while pin management data 501 is generated for the logic gate data 401 of the generating gate 120. The pin management data 500 has a fault assumption number 502 on the input side (input fault assumption number), a fault assumption number 503 on the output side (output fault assumption number), fault data 504 and 505 on the input side (input fault data) and fault data 504, 506, 507 and 508 on the output side (output fault data). The input fault assumption number 502 and the output fault assumption number 503 represent the number of positions of the input and output pins in which the assumption of the fault is required to be made in the logic circuit prior to logic modification. The input fault data 504 and 505 and the output fault data 504, 506, 507 and 508 represent fault assumption data when the fault is incorporated into each of the input and output pins. More specifically, the input fault data consists of pin data 504 representing the positions of the input and output pins assuming a fault prior to the logic modification and an input number 505 representing correspond of the positions of the input and output pins to which input of the logic gate subsequent to the logic modification. The output fault data consists of the pin data 504 and equivalent flags 506, 507 and 508 representing which output of the logic gate subsequent to the logic modification is equivalent to the positions of the output pins assuming the fault prior to the logic modification. The equivalent flags 506, 507 and 508 referred to herein correspond to each of the output pins of the logic gate and the equivalent flags are provided so as to correspond to the number of the outputs of the gate (in this embodiment, three flags are provided so as to correspond to three outputs). The equivalent flag is set to "1" when the corresponding output is equivalent and the equivalent flag is set to "0" when the corresponding output is not equivalent. It is noted that the pin management data 500 of FIG. 5 represents pin management data between pin data of the gate 1 (FIG. 1) prior to the logic modification and the pin of the basic gate 100 (FIG. 2) in describing the gate of the logic gate data (FIG. 4) when the fault is assumed for each pin of the logic gate in the logic circuit to be the object for the fault simulation.

As described hereinabove, the logic modification is performed into the circuit configuration by the logic gate of the basic gate form, and the logic gate data and the pin management data are generated. Thereafter, a fault logic value is incorporated into the fault assumption position of the logic gate and then the processing of the fault simulation is implemented. The following is a description of an example of processing the fault simulation.

FIG. 6 is a flowchart for describing the operation of the fault simulation processing by using a vector processor, in conjunction with the flow of data. The vector processor enables the batch parallel processing of the operation of each vector element by using a vector register 620, thereby implementing the processing operation at a high speed.

Description will first be made of the method of simulating the logic value of each gate in a state prior to the incorporation of the fault logic value by means of the event propagation technique in conjunction with FIG. 6. A gate data memory 611 stores the logic gate data for all of the gates as shown in FIG. 4. And an event table 610 stores and address of the logic gate data corresponding to the logic gate among all of the gates, in which the event is propagated.

After the system has been started at step 600, the program flow goes to step 601 at the logic function of the logic gate data is read. In step 601, the logic function data 402 is read from the gate data memory 611 for all the gates to be indexed from the event table 610 and the read logic function data is loaded into a vector register VRa. Then, the program flow goes to step 602 at which the input value of the logic gate data is red buy reading the logic values of the three inputs from the gate data memory 611 for all of the gates to be indexed from the event table 610. More specifically, the logic value is read out by giving the logic gate data connected on its input side from the connect node pointer (405; FIG. 4) of the gate connection data on the input side of each of the logic gate data (400 and 401; FIG. 4) and reading the logic value data 403. First, the logic value data 403 of input 1 is read by reading the logic value data ("1", "0", "1", ...) 403 of the logic gate data indicated by pointers (204, 205, 203, ...) of input 1, then by loading the result into a vector register VRb. Likewise, the logic value data 403 of input 2 is read by reading the logic value data ("0", "1", "1", ...) 403 of the logic gate data indicated by the pointers (205, 203, 204, ...) of input 2, and the result is loaded into a vector register VRc. Further, the reading of the logic value data 403 of input 3 is implemented by reading the logic value data ("1", "1", "0", ...) 403 of the logic gate data indicated by pointers (203, 204, 206, ...) of input 3, and the result is loaded into a vector register VRd. This operation allows the logic values of input 1, input 2 and input 3 of each gate to be loaded in the respective vector registers VRb, VRc and VRd. Then, at step 603, the logic values loaded in the vector registers VRb, VRc and VRd are subjected to logical operation to be instructed by the vector register VRa and the result is stored in a vector register VRe. Processing proceeds to step 604 at which a decision is made to determine if the logic value stored in the vector register VRe has been changed. If it is decided at step 604 that the logic value has been changed, that is, that the logic value stored in the vector register VRe is different from a value of the logic value data 403 stored in the gate data memory 611, the program flow goes to step 605. Event registration is performed in step 605 in such a manner that a next event table 612 stores an address of the gate to be connected to the output of the gate in which the logic value has been changed. Thereafter, at step 606, the result of the logical operation stored in the vector register VRe is then stored in the logic value data 403 in the gate data memory 611, followed by the end of the processing. On the other hand, if it is decided at step 604 that the result of the logical operation, or the logic value, has not been changed, no processing is required and the processing ends. This concludes a first series of the processing of the event propagation. Thereafter, the event table 610 is replaced by the next event table 612 and the same processing is repeated, thereby performing the processing of the event propagation in order and logically simulating the logic circuit as a whole.

In the embodiment as described hereinabove, the numbers of the inputs and outputs of the basic gate are fixed at three inputs and three outputs. The gate is formalized so that the logic gate data can be of fixed-length data and the operation can be made by the fixed-length data. Therefore, the logical operation can be implemented by a vector instruction using the vector register in the vector processor, thereby permitting logical simulation at a high speed. This system can also process the fault simulation at a high speed, which repeats the logical simulation by injecting various fault logic values.

Description will then be made of the fault injection processing for injecting the fault logic value into the input and output pins of each of the logic gates in performing the logical simulation in the manner as described hereinabove.

Figure 3B:
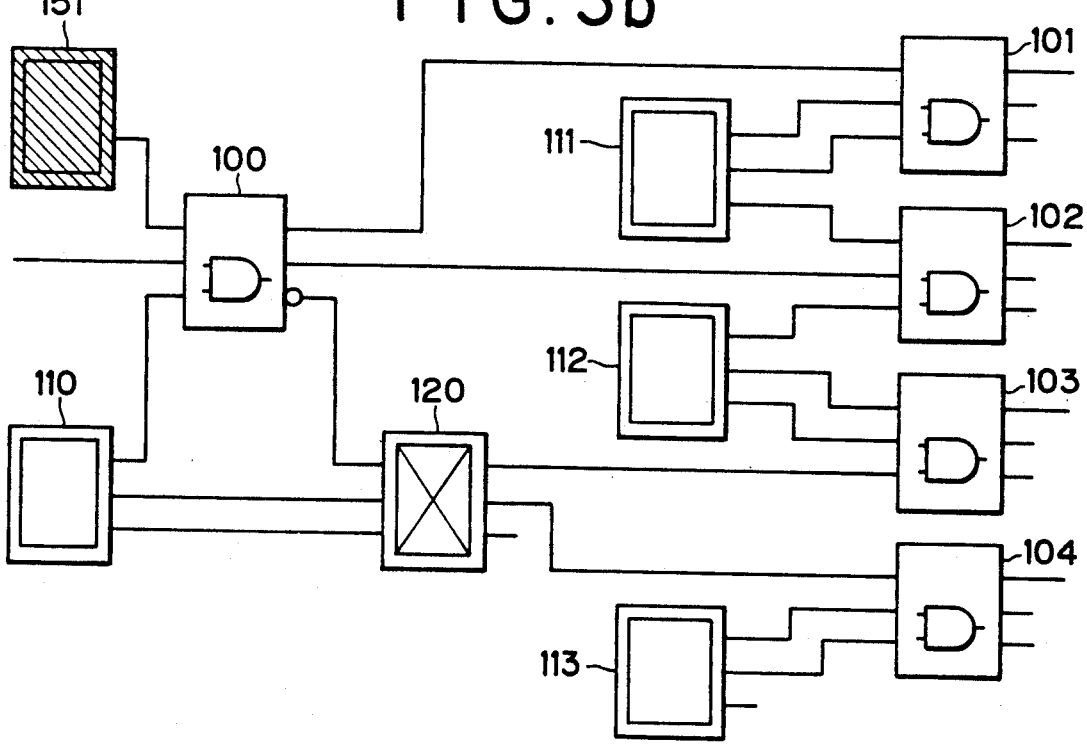

FIGS. 3a and 3b are diagrammatic representations of the configuration of the logic circuit in injecting the fault by connecting fixed value gates to the logic circuit of FIG. 2.

Description will now be made of the instance of injecting the fault into the output side with reference to FIG. 3a. For instance, when the fault is injected into the output side of the basic gate 100 corresponding to the gate 1, the fault of logic value "1" ("1" degeneracy fault) is injected into the pin P3 of the output of the gate 1 (FIG. 1) by changing a connection on the side of a fan-out (rear stage) with reference to the pin management data 500 (FIG. 5) of the basic gate 100 corresponding to the gate 1. In other words, the connection of the input of the basic gate 101 and the basic gate 102 leading to the output in which the equivalent flags 506, 507 and 508 for the output fault data of the pin management data 500 are set to one is changed to a fixed value gate 150 having logic value 1 for the fault logic value. As described hereinabove, the fault logic value is injected by modifying the logic circuit of FIG. 2 into the logic circuit as shown in FIG. 3a by adding the fixed value gate (fault-injection fixed value gate) 150 issuing the fault logic value to the logic circuit of FIG. 2 as well as by changing the connection among the basic gate 100, the basic gate 101 and the basic gate 102.

Now, the instance of injecting the fault in the input side will be described with reference to FIG. 3b by taking as an example the case in which the fault is injected into the input side of the basic gate 100 corresponding to the gate 1. In this case, too, the fault logic value is injected by referring to the pin management data 500 (FIG. 5) of the basic gate 100 corresponding to the gate 1. For instance, when the fault of logic value "0" ("0" degeneracy fault) is injected into the input pin P1 of the gate 1 in the same manner as described hereinabove, the injection is performed by changing the connection on the side of the fan-out (front stage)—that is, by changing the connection of input 1 of the basic gate 100 indicated by the input number 1 of the input P1 of the input fault data of the pin management data 500 to a fixed value gate 151 having logic value "0" of the fault logic value. In other words, the fault logic value is injected by changing the connection of the input 143 of FIG. 2 so as to be connected to the fixed value gate 151 having logic value "0". In this case, the injection of the fault logic value is performed by adding the fixed value gate 151 issuing the fault logic value to the logic circuit of FIG. 2 as well as by changing the connection of the basic gate 100, thereby making modifications to the logic circuit as shown in FIG. 3b.

In order to simulate the logic value possessed by each gate after the injection of the fault logic value, the fault simulation is processed by the logic simulation method in accordance with the event propagation technique as described hereinabove in FIG. 6 by using a group of logic gate data describing the logic circuit as shown in FIG. 3a or in FIG. 3b.

As described hereinabove, the present invention permits fault simulation without performing any special processing of the fault injected, by describing the logic circuit modified by an addition of the least possible number of generating gates and by the use of the gate having the fixed input and output pins, so that the present invention can perform the fault simulation for a large-scale logic circuit at a high speed and with high accuracy.

It is to be noted herein that although the present invention has been described hereinabove by way of the embodiments, the present invention is not understood to be restricted to those embodiments, but it is to be understood that the present invention encompasses various modifications and variants within the scope of the invention.

As described hereinabove, the fault simulation method according to the present invention permits a ready injection of the fault logic value on the basis of the pin management data into the logic circuit modified logically so as to be processed by the vector processor. Further, the present invention permits fault simulation after the injection of the fault logic value to be executed at a high speed without distinction between the absence and presence of the fault logic value injection by a connection to the fixed gate issuing the fault logic value.

What is claimed is:

1. A fault simulation method for detecting a fault in a logic circuit comprising one or more logic gates having pins for data input and data output and functioning as an object of fault simulation, on the basis of logic simulation to be implemented by injecting a fault logic value into a position of fault assumption in the logic circuit, comprising the steps of:

performing logical modification of the logic circuit into a logic circuit configuration including logic gates of a predetermined basic gate form;

forming pin management data for the logic gates of the logic circuit after the logical modification which indicates correspondence of pins of the modified logic circuit to the position of fault assumption of each of the pins prior to the logical modification;

injecting the fault logic value into the position of fault assumption of pins of the gate of the logic circuit subsequent to the logic modification in a position corresponding to each of the pins prior to the logic modification based on the pin management data; and executing fault simulation using the logic circuit into which the fault logic value is injected.

2. A fault simulation method as claimed in claim 1, wherein the fault logic value is injected by connecting a fixed value gate of said predetermined basic gate form for generating the fault logic value to a pin located in the position of fault assumption when the fault logic value is injected.

3. A fault simulation method as claimed in claim 1, wherein said predetermined basic gate form functions as a circuit element having a fixed number of inputs and outputs.

4. A fault simulation method as claimed in claim 1, further comprising the step of:

generating a group of logic gate data consisting of an aggregate of logic gate data representing each logic gate describing the logic circuit configuration obtained by said logical modification of the logic circuit;

wherein said pin management data formed in said forming step is formed to correspond to the logic gate data.

5. A fault simulation method as claimed in claim 4, wherein:

said predetermined basic gate form functions as a circuit element to be logically modified having a fixed number of inputs and outputs;

the logic gate data representing the logic gate is data having a fixed length; and each of the logic gate data includes logic functions data, logic value data and gate connection data.

6. A fault simulation processing method for implementing logical simulation processing with a vector processor by using a logic circuit into which a fault logic value is injected in the fault simulation method as claimed in claim 4, further comprising the steps of:

a first step of reading into a first vector register logic function data of the logic gate data for all of the logic gates specified by an event table from a gate data memory storing a group of the logic gate data representing a logic circuit configuration subsequent to injection of the fault logic value;

a second step of reading into a second vector register input logic value data of the logic gate data for all of the logic gates specified by the event table from the gate data memory storing the group of the logic gate data representing the logic circuit configuration subsequent to the injection of the fault logic value;

a third step of performing a logic operation of a logic function stored in the first vector register for aN input logic value stored in the second vector register and storing the result of the logic operation into a third vector register;

a fourth step of registering the logic gate with a changed logic value into a next event table and storing the changed logic value as a logic value of the logic gate data of the corresponding logic gate of the gate data memory; and a fifth step of repeating processing of the first step through the fourth step using a content of the next event table registered in the fourth step as the content of said event table.

7. A fault simulation method as claimed in claim 4, wherein the pin management data formed to correspond to the logic gate data comprises the number of fault assumptions, and input fault data and output fault data of the input and output pins of the logic gates prior to logical modification.

8. A fault simulation method as claimed in claim 7, wherein the output fault data of the pin management data contains pin data and an equivalent flag; and an identical fault logic value is injected into a plurality of the output pins by an instruction of the equivalent flag.

* * * * *

UNITED STATES PATENT AND TRADEMARK OFFICE
CERTIFICATE OF CORRECTION

PATENT NO. : 5,184,308

DATED : February 2, 1993

INVENTOR(S) : Masahiko NAGAI, et al.

It is certified that error appears in the above-identified patent and that said Letters Patent is hereby corrected as shown below:

Column 1, line 16, change "operation" to --operations--.

Column 2, line 50, between "spondence" and "the" insert --of each of--.

Column 2, line 64, delete the comma after "data".

Column 3, line 24, delete "which".

Column 4, line 45, beginning with "The logical" should start a new paragraph.

Column 4, line 65, delete the comma after "113".

Column 5, line 50, change "outputs" to --output is--.

Column 6, line 21, change "correspond" to --correspondence--.

Column 6, line 22, delete "which".

Column 6, line 68, change "and" to --an--.

UNITED STATES PATENT AND TRADEMARK OFFICE
CERTIFICATE OF CORRECTION

PATENT NO.  : 5,184,308
DATED       : February 2, 1993
INVENTOR(S) : Masahiko NAGAI, et al.

It is certified that error appears in the above-identified patent and that said Letters Patent is hereby corrected as shown below:

Column 7, line 4, between "at" and "the" insert --which--.

Column 7, line 10, change "red buy" to --read by--.

Column 7, line 20, between "by" and "pointers" insert --the--.

Column 10, line 18, change "functions" to --function--.

Signed and Sealed this

Fourth Day of January, 1994

BRUCE LEHMAN

*Attest:*

*Attesting Officer*    Commissioner of Patents and Trademarks